United States Patent

Phelan, Jr.

[15] 3,649,838

[45] Mar. 14, 1972

[54] SEMICONDUCTOR DEVICE FOR PRODUCING RADIATION IN RESPONSE TO INCIDENT RADIATION

[72] Inventor: Robert J. Phelan, Jr., Concord, Mass.

[73] Assignee: Massachusetts Institute of Technology, Cambridge, Mass.

[22] Filed: July 25, 1968

[21] Appl. No.: 747,520

[52] U.S. Cl. ....................250/211 J, 250/213 R, 317/235 N

[51] Int. Cl. ....................H01j 39/12

[58] Field of Search ....................250/213, 83.3 HP, 211 J; 317/235 N

[56] References Cited

UNITED STATES PATENTS

| | | | |
|---|---|---|---|
| 3,339,074 | 8/1967 | Franks | 250/213 |
| 3,427,461 | 2/1969 | Weekler | 250/211 J |
| 3,448,275 | 6/1969 | Hall | 250/211 J X |
| 3,465,159 | 9/1969 | Stern | 250/213 |
| 3,466,441 | 9/1969 | Batdorf et al. | 250/213 X |
| 3,497,698 | 2/1970 | Phelan | 250/211 J X |

*Primary Examiner*—James W. Lawrence
*Assistant Examiner*—D. C. Nelms
*Attorney*—Thomas Cooch, Edward D. Thomas and Robert T. Dunn

[57] ABSTRACT

A semiconductor device for producing radiation in response to incident radiation of wavelength is made of a sandwich of semiconductor materials providing electrically in series a radiation detector which responds electrically to incident radiation, a capacitor for integrating the effect of the incident radiation and a radiation emitting diode which produces output radiation of a different wavelength and of intensity representative of the intensity of the incident radiation.

18 Claims, 9 Drawing Figures

INVENTOR.
ROBERT J. PHELAN
BY Robert T. Dunn
ATTORNEY

INVENTOR.
ROBERT J. PHELAN
BY Robert T. Dunn
ATTORNEY

INVENTOR.
ROBERT J. PHELAN
BY Robert T Dunn
ATTORNEY

INVENTOR.
ROBERT J. PHELAN
BY Robert T. Dunn
ATTORNEY

SEMICONDUCTOR DEVICE FOR PRODUCING RADIATION IN RESPONSE TO INCIDENT RADIATION

The invention herein described was made in the course of work performed under a contract with Electronic Systems Division, Air Force Systems Command, U.S. Air Force.

The invention relates to devices for intercepting radiation of one wavelength and producing radiation of another wavelength representative thereof, and, more particularly, to a solid state device for this purpose, made up of layers of selected semiconductor materials so selected and designed to have relatively high photon collection quantum efficiency with respect to the incident radiation.

Radiation conversion has been accomplished in a semiconductor device consisting of a reverse biased heterojunction of N-type Ge and P-type GaAs in series with a forward biased homojunction of the P-type GaAs and N-type GaAs. The composite structure is electrically energized by a DC voltage to bias the diodes as described. Infrared radiation of 1.5 micron incident on the Ge causes a photocurrent to flow through the structure. This current causes the GaAs to electroluminesce emitting radiation of 0.9 micron wavelengths. The internal wavelength conversion efficiency of the heterojunction is very low and so the wavelength conversion efficiency is also very low. This is due principally to the low electroluminescence quantum efficiency of the GaAs PN homojunction at the low injection current densities at which the device must be operated.

It is an object of the present invention to provide a solid-state radiation converter having an overall external conversion efficiency of incident photons to output photons which is substantially greater than obtained heretofore with solid-state devices of this sort.

It is another object of the present invention to provide a solid-state sandwich including a radiation detector, means for integrating or storing the effect of incident radiation and a radiation emitter responsive to the integrated effect, whereby improved conversion efficiency is achieved.

It is another object of the present invention to provide a radiation converter for converting infrared radiation to visible radiation.

It is another object of the present invention to provide a radiation converter which integrates relatively low level incident radiation and energizes a radiation emitter with relatively high energy pulses representative of the integrated radiation.

It is another object of the present invention to provide a solid state device for converting incident radiation into output radiation, which accomplishes the conversion with relative high efficiency and can be tuned to vary contrast and sensitivity.

It is another object of the present invention to provide such a device for converting 5.4-micron wavelength incident radiation to visible radiation of wavelength between 0.6 and 0.7 micron.

It is another object of the present invention to provide a solid-state device for converting an image at one wavelength into the same image at another wavelength.

The solid-state radiation converter described in the present application is formed in a single solid-state unit which includes a radiation detector which responds to the incident radiation, a storage capacitor, and a radiation emitting diode, in electrical series so designed and energized that the electrical effect of relatively low level radiation incident on the detector is integrated over a sufficient interval for the system to conduct relatively high current pulses through the radiation emitter of amplitude which varies directly as the intensity of the incident radiation. Thus, the emitter operates efficiently, producing output radiation intensity which varies directly as the intensity of the incident radiation. The capacitor is sufficiently high so that its capacitance exceeds the effective capacitance of the detector and emitter, allowing for relatively long integration time and by this means providing high sensitivity to the intensity of incident radiation.

Preferred embodiments of the present invention form the radiation detector and capacitor, such as described above, of a metal oxide semiconductor (MOS) or, more generically, from a metal insulator semiconductor (MIS) structure such as described in considerable detail in copending application, Ser. No. 697,418, entitled "Metal Insulator Semiconductor Radiation Detector," filed Jan. 12, 1968. Any of the structures described in that application can be used to form the radiation detector and integrating capacitor that forms a part of embodiments described herein and contemplated by the present invention.

A particularly useful embodiment of the present invention includes a sheet of semiconductor material formed of layers such that through the thickness of the sheet at every point over a substantial area of the sheet, there is, in effect, in electrical series a detector, an integrating capacitor, and an emitter such as described above. Furthermore, the thickness of this sandwich of semiconductor layers and the semiconductor materials are so selected and/or treated that the amplitude of the high current pulse conducted by the emitter at a given point on the sheet is determined by the intensity of radiation incident at that point. Furthermore, the high current pulse is conducted by the emitter at the same point with very little cross conductance or cross charging between adjacent points on the sheet. Thus, an image of incident radiation focused on the sheet will be reproduced by the sheet at the output wavelength, and so the incident image at one wavelength is converted to the same image at another wavelength. For example, an infrared image at 5.3 microns can be converted to a visible image at a wavelength between 0.6 and 0.7 micron. This embodiment clearly has effective use in conjunction with a TV camera which is designed for operation in the visible range to see in the infrared.

Other objects and features of the invention will be apparent from the following specific description taken in conjunction with the Figures, in which.

The metal oxide semiconductor (MOS) detector, or more generically described as a metal insulator semiconductor (MIS) detector, described in the above-mentioned copending application, Ser. No. 697,418, is described and demonstrated in that application as a capacitor in series with a diode and is made by forming a layer of insulator, which may be oxide, on a surface of a body of semiconductor material, then forming a layer of conductor on the insulator. The insulating layer is described as an oxide of the semiconductor and may be formed by merely anodizing the surface of the semiconductor. The oxide as described in the application causes a depletion region immediately adjacent thereto in the body of the semiconductor material, and so a PN-like junction is formed in the semiconductor material which exhibits the characteristics of a diode. The thickness of the insulator layer is sufficient so that the capacitance across the insulator is substantially greater than the shunt capacitance across the diode formed in the semiconductor body, so when the structure is energized with electrical pulses in the diode forward direction, the shunt capacitance will charge immediately insuring diodelike behavior across the depletion region while the insulator series capacitor is charged by the pulses. Thereafter, when photons of a particular wavelength are incident on the diode depletion region, the capacitor discharges through the depletion region diode in the reverse direction at a rate dependent on the intensity of the incident photons. In accordance with the present invention, a radiation emitting diode is added to this structure and the combination is energized in the forward direction by electrical pulses from a pulse generator. These are high current pulses and cause the emitter diode to emit output radiation. The magnitude (amplitude) of these current pulses depend upon the extent to which the capacitor has been discharged since the previous pulse and this is controlled by the incident radiation. Thus, the output radiation intensity which is determined by the amplitude of the current pulses, varies directly with the intensity of the incident radiation.

Figure 1:
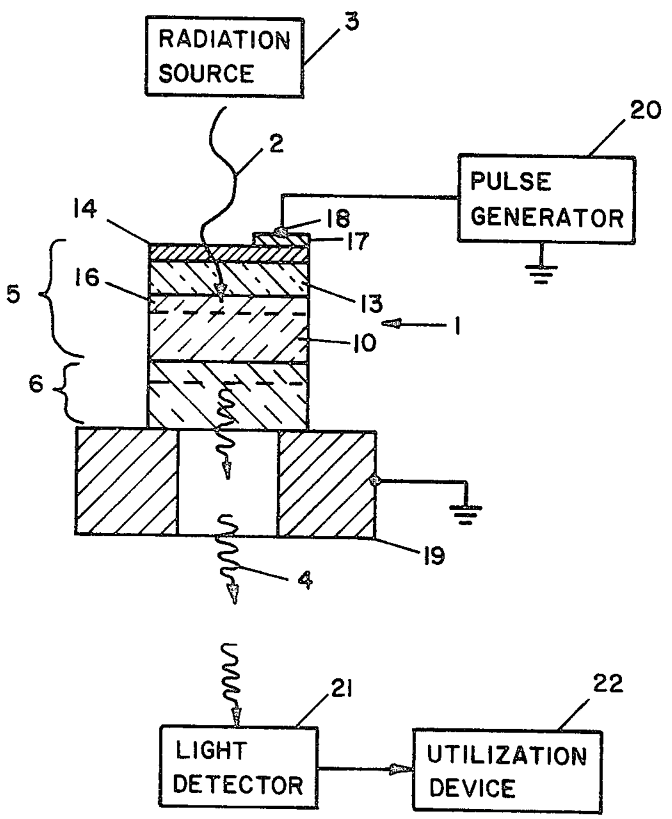
FIG. 1 is a structural and system diagram showing an embodiment of the present invention which responds to incident radiation of one wavelength and produces output radiation of another wavelength, the conversion being accomplished in a relatively thin layer sandwich of semiconductor materials.

FIG. 1 illustrates in cross section a sandwich of semiconductor materials which converts incident radiation 2 from a source 3, which may be infrared radiation, to output radiation 4, which may be visible radiation. The radiation converter 1 is a sandwich of semiconductor materials which can be defined as a storage capacitor and radiation detecting diode 5, in series with a radiation emitting diode 6. The detecting diode and capacitor 5 is constructed as any of the MOS or MIS structures described in the above-mentioned copending application. It includes a relatively large area semiconductor chip 10 with an insulator layer 13 formed on the surface of the semiconductor body over a relatively large area of the surface and an electrically conductive film 14 formed on the insulator layer. The conductive film 14 and insulator layer 13 are transparent to the incident radiation 2 which is directed to a depletion region 16 in the body 10, immediately adjacent the insulator layer.

The formation of this depletion region may be understood from a model of band curvature in the semiconductor material near the insulator layer and the extent of depletion of charge in region 16 can be increased by applying a DC field through the layer. The diode characteristics produced by this depletion layer are clearly described in the mentioned application. Thus, the metal layer 14, oxide layer 13, on the semiconductor 10 form the metal oxide semiconductor (MOS) which has the electrical characteristics of a capacitor in series with the photoresponsive diode.

The emitter diode 6 is formed contiguous with the semiconductor 10 and may be a PN junction diode, which emits radiation of a selected wavelength when energized by current pulses through the MOS structure 5.

The semiconductor material 10 is selected to provide a photovoltaic response to the incident radiation 2. If the incident radiation is infrared at a wavelength of about 5.3 microns, a suitable semiconductor material is N-type InSb with a bulk concentration of between $10^{14}$ and $10^{16}/cm.^3$. The insulating layer 13 may be formed by anodizing the surface of the InSb to produce the oxide or a layer of suitable insulating material such as pyrolytic $SiO_2$ may be formed on the surface. The conductive layer 14 is preferably transparent to the incident radiation 2 so that the radiation can be directed to the semiconductor body 10. For example, conductive layer 14 may be a nickel film evaporated onto the oxide forming a thickness of about 100 A. The thickness of the oxide layer 13 and the area of the layer will determine the capacitance. For example, a capacitance of 0.01 microfarad is obtained when the oxide layer is about 0.04 $cm.^2$ and on the order of 500 A thick. A small area of gold 17 is evaporated on the nickel layer 14 to accommodate contact 18.

The emitter diode 6 used in conduction with the InSb MOS detector 5 is a GaAsP emitting diode and may be formed in a conventional manner on the bottom side of the InSb chip 10.

The composite structure 5 and 6 is mounted on a cold finger 19, which is part of a cryogenic system (not shown) for maintaining the temperature of the device at about 77° K.

In operation, the cold finger 19 may be at ground potential. The output of a pulse generator 20 is coupled to the film 14 by contact 18 to the gold film 17. Infrared radiation 2 at about 5.3 micron wavelength is directed to the InSb semiconductor chip 10 while pulses are applied to the conductor layer 14 from the pulse generator 20. As will be described below, the pulses are of short duration and immediately charge the shunt capacitances across the detector diode formed in the chip 10 and the emitter diode 6, whereupon the relatively larger capacitor in series with this diode and formed by the oxide layer 13, is charged through the diodes by the pulse. Thereafter, between pulses from the pulse generator 20, the series capacitor discharges at a rate controlled by the intensity of the incident infrared radiation. The pulses from the generator 20 are relatively high current pulses and when conducted by the GaAsP diode emitter 6 produce the visible radiation 4 at a wavelength between 0.6 and 0.7 microns. The amplitude of each high current pulse will depend on the amount of charge required to restore the charge on the series capacitor which discharges partially between pulses depending on the intensity of the infrared radiation. Thus, the output radiation 4 is delivered in pulses at the same rate as the pulses from generator 20 each of intensity representative of the integrated infrared radiation during the preceding intervals between pulses. The output radiation 4 may be detected by a light detector 21 operating in conjunction with a utilization device 22 for a variety of purposes, some of which will be mentioned or described below.

Figure 2:
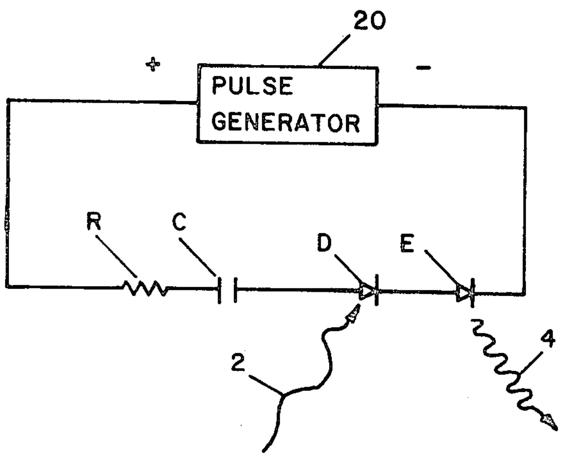
FIG. 2 is a simple electrical diagram which is suggested as the electrical equivalent of the semiconductor sandwich, which converts radiation.

In order to explain more fully the operation of the radiation converter 1 and the system shown in FIG. 1, an equivalent electrical diagram is suggested as shown in FIG. 2. The equivalent circuit shown in FIG. 2 includes the pulse generator 20 with a source impedance R which supplies pulses to the series connected capacitor C, diode detector D, and light emitter E. The capacitor C represents the capacitance across the oxide layer 13. The diode D is the photoresponsive diode formed in the chip 10 of InSb by virtue of the depletion layer 16, which exists due to the oxide layer 13. The diode E is the emitter diode 6 formed by the GaAsP PN junction.

Figure 7:
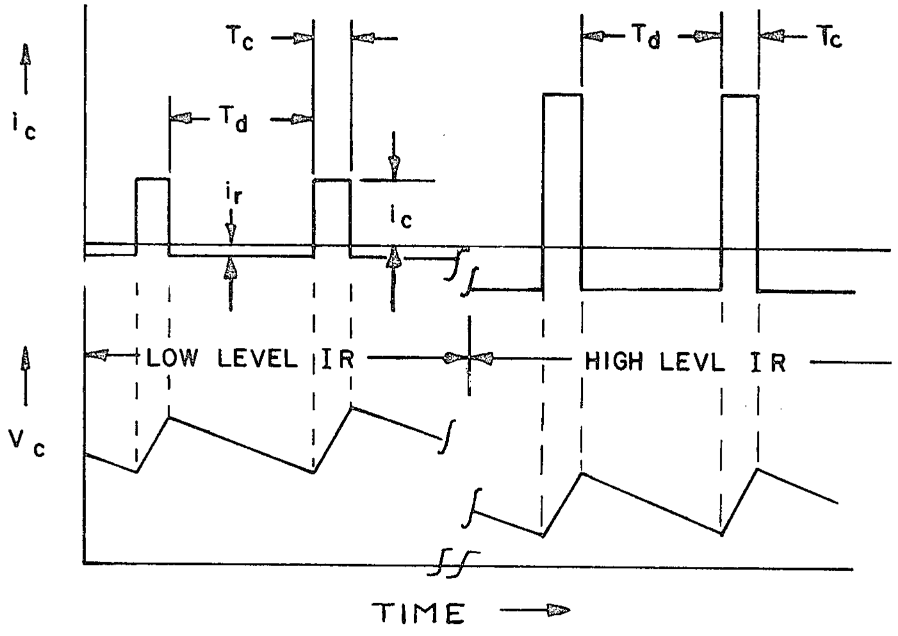
FIG. 7 illustrates the current and voltage waveforms, illustrating the capacitor voltage and detector forward and reverse currents for two levels of incident infrared radiation.

Charging current pulses $i_c$ of the polarity shown in FIG. 7 drive the emitter E and at the same time charge the capacitor C in the forward direction through detector D. Between pulses, the series capacitor C discharges through the series connection R, D and E. During this discharge, the detector is reverse biased and the current $i_r$ is controlled by the intensity of incident infrared radiation. Because the charging resistance is much less than the discharge resistance, charging is accomplished in a relatively short time compared to the discharge time. In equilibrium, the charge supplied to the capacitor C during the charging pulse equals the charge drain during the discharge interval, thus the charge is drained at a low level of current $i_r$ controlled by the infrared radiation and restored at higher current levels $i_c$ by driving the emitter E. Approximate waveforms for the capacitor C, voltage $V_C$, and the emitter $I_c$ for two levels of incident radiation, (IR), are shown in FIG. 7. The two levels are denoted low level and high level IR. These curves correspond in time as indicated by the vertical lines which extend from one to the other.

An equation for the charging current $i_c$ can be expressed in simple form. It is assumed that the detector diode D has the current voltage characteristics shown very simply in FIG. 3. These characteristics are simplified in order to permit the following circuit analysis which serves to explain the operation. $i_{rm}$ corresponds to the lower level or minimum level of infrared radiation and $i_{rM}$ corresponds to the maximum level of infrared radiation. The charging current is given by:

$$i_c=\frac{i_rT_de^{-t/RC}}{RC(1-e^{-T_c/RC})} \qquad (1)$$

where $i_r$ is the detector reverse current, $T_d$ is the discharge interval, $t$ is the time, $R$ is the series charging resistance, $C$ the capacitance and $T_c$ is the charging interval. For $T_c<<RC$, which also implies $t<<RC$, equation (1) simplifies to:

$$i_c=i_rT_d/T_c \qquad (2)$$

Thus, to have a large ratio $i_c/i_r$, integration must be for a relatively long time, $T_d$, and charging for a short time, $T_c$. For a given maximum infrared power there is a maximum discharge time for equation (1) to be valid. In deriving equation (1) the integral of the discharge current is equated to the integral of the charging current, but should the capacitor completely discharge it discontinues to integrate the incident flux. The maximum discharge time allowed will correspond to the maximum infrared intensity which is to be discriminated, and this time is given by:

$$T_{dM}=EC\frac{(1-e^{-T_c/RC})}{i_{rM}} \qquad (3)$$

where E is the pulse source voltage and $i_{rM}$ is the maximum reverse current of the detector. Setting $T_d$ equal to $T_{dM}$, equation (2) becomes:

$$i_c=i_r\frac{Ee^{-t/RC}}{Ri_{rM}} \qquad (4)$$

Figure 3:
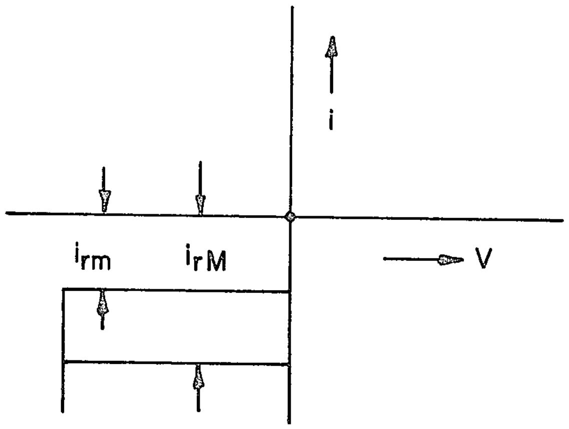
FIG. 3 illustrates ideal current-voltage characteristics of the detector diode portion of the semiconductor sandwich.

Now for $i_c/i_r$ to be large, $E/R$ must be made large. $E$ will eventually be limited by the breakdown voltage of the capacitor C or, as indicated in FIG. 3, the reverse breakdown of the diode detector D. The maximum voltage which will appear across the capacitor, which is also the reverse voltage applied to the detector, will depend upon the minimum reverse current, $i_{rm}$, to be discriminated. The maximum applied voltage, $E_M$, is given by:

$$E_M=\frac{V_b}{1-\frac{i_{rm}}{i_{rM}}e^{-T_c/RC}} \qquad (5)$$

where $V_b$ is the lower of the breakdown voltages limited by the capacitor or detector. Using these maximum voltage pulses, equation (4) becomes:

$$i_c=i_r\cdot\frac{V_be^{-t/RC}}{R(i_{rM}-i_{rm}e^{-T_c/RC})} \qquad (6)$$

Thus, the limit as $T_c\rightarrow 0$ is:

$$\frac{i_c}{i_r}=\frac{V_B}{R(i_{rM}-i_{rm})} \qquad (7)$$

From this result, the ratio of $i_c/i_r$ is limited only by the range $i_{rM}$ to $i_{rm}$ that is to be detected: a smaller range will allow for a larger ratio.

Figure 4:
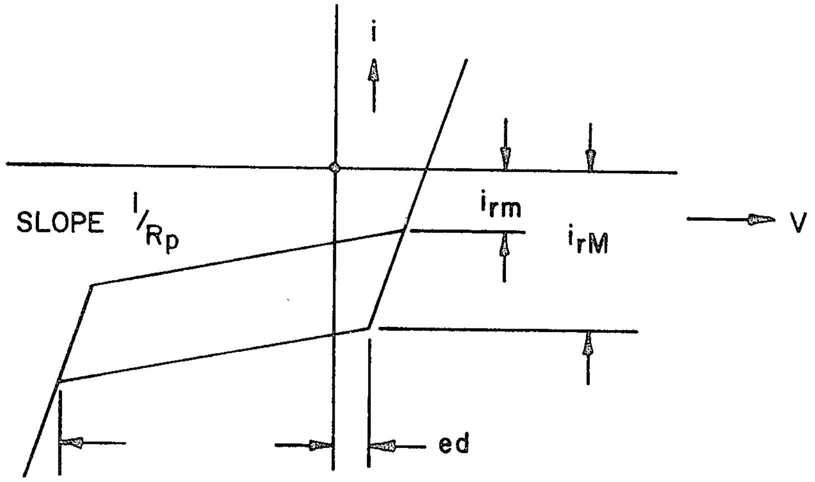
FIG. 4 illustrates the DC current-voltage characteristic of the detector diode in the semiconductor sandwich.

Thus far, the ideal characteristics shown in FIG. 3 have been used. The preceding discussion may be extended to incorporate FIG. 4 which gives a closer approximation of the detector diode characteristics. The effect of the photovoltage $e_d$ is to add to $E_M$. The slope $1/R_s$ gives a series diode resistance $R_s$ which can be added to the series resistor R of the previous calculations. The slope $1/R_P$ gives an effective paralleling resistance which will shorten the capacitor discharge time. Assuming $R_P>>R$, where $R$ includes $R_s$, the charging current is given by $$i_c=\frac{E_s}{R}\left(1-\frac{i_{rM}}{i_{rM}+\frac{E_s}{R_p}}+\frac{i_r}{i_{rM}+\frac{E_s}{R_p}}\right)e^{-t/RC} \qquad (8)$$

where $E_s$ is now the sum of the applied voltage $E$ and $e_d$. The breakdown limitation now yields a larger $E_M$, but it is still limited to the range:

$$\frac{V_B}{1-\frac{i_{rm}}{i_{rM}}e^{-T_c/RC}}E_M\frac{V_B}{1-e^{-T_c/RC}} \qquad (9)$$

as $R_p$ goes from $\infty$ to small values (note it is still assumed $R_p>>R$). If $i_{rm}/i_{rM}\cong 1$ then $E_m$ is not modified by $R_p$. Also, equation (8) yields:

$$\frac{\Delta i_c}{\Delta i_r}=\frac{E_se^{-t/RC}}{R\left(e_{rM}+\frac{E}{R_p}\right)} \qquad (10)$$

From equation (10), the limit for large $E_s$ can be expressed:

$$\lim_{E_s\rightarrow\infty}\frac{\Delta i_c}{\Delta i_r}=\frac{R_p}{R}e^{-t/RC} \qquad (11)$$

Thus, regardless of the breakdown voltage, the ratio of the parallel resistance to the series resistance puts an upper limit on the ratio of the change in peak charging current to the change in discharge current.

Although FIG. 3 may be a good approximation to the DC current-voltage characteristics of the detector diode, it ignores the detector junction capacitance, and ignores the properties of the light emitter. It assumes that the detector capacitance is negligible compared to the added series capacitor. A shunt capacitance in the emitter will put a lower limit on the charging time $T_c$, and this puts an upper limit on $\Delta i_c/\Delta i_r$. The resistance of the emitter must be much less than $V_c/i_r$ during discharge, and its resistance during charging will add to R, thereby decreasing $\Delta i_c/\Delta i_r$. Further discussion of these limitations set forth below relates them to experimental results. The experimental results which will be discussed below relate to the light converter 1 constructed and operated as described with reference to FIG. 1, including MOS InSb structure 5 and a GaAsP emitter 6.

During the charging pulses from the pulse generator 20, the emitter 6 is forward biased giving pulses of visible light 4. The oxide layer 13 may be on the order of 0.04 cm.² and 500 angstroms thick, which produces a capacitance for the capacitor C equivalent thereof of 0.01 microfarad. This is approximately 0.2 microfarad/cm.², which is to be compared with the value of approximately 0.03 microfarad/cm.² of the InSb detector and 0.02 microfarad/cm.² for the GaAsP emitter. Thus, for an equal area system throughout the radiation converter 1, the capacitance of the series capacitor (C) exceeds the combined capacitance of the detector formed in the InSb chip 10 and the emitter 6 by at least an order of magnitude. Clearly, improved efficiency can be gained by making the area of the emitter 6 smaller than the area of the detector 10 and, thereby reducing the emitter capacitance.

For example, when the oxide layer 13 on the InSb chip 10 has an area of 0.04 cm.² and is 500 angstroms thick, the capacitance C thereof is 0.01 microfarad. Furthermore, when the area of the emitter is 0.01 cm.² (one-fourth the area of the detector 10) the following response is obtained:

1. incident radiation wavelength—5.3 microns
2. incident radiation intensity—100 microwatts/cm.²
3. $T_c$=0.1 microsecond
4. $T_d$=100 microseconds
5. $i_c$=10 milliamps Under these conditions, the peak light pulses from the emitter 6 are about 50 foot Lamberts with an average luminescence of $5\times10^{-}$foot Lamberts. This corresponds to the conversion of the incident 5.3-micron radiation into a signal which is visible with the naked eye. The overall quantum efficiency of infrared photons to visible photons is about $10^{-4}$ and is principally limited by the peak efficiency of the emitter 6.

Figure 5:
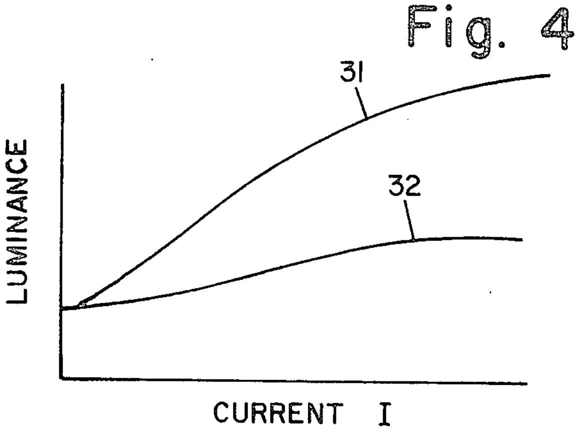
FIG. 5 illustrates luminescence as a function of DC current, for a particular radiation emitter formed in the semiconductor sandwich.

The light output from a GaAsP diode emitter operating at room temperature is shown in FIG. 5. The upper curve 31 shows the luminescence as a function of DC applied current. The lower curve 32 shows the average luminence obtained from a 10 microampere signal by integrating and converting short high peak currents. Thus, it is found that a current of 10 microamps gives $5\times10^{-4}$ foot Lamberts of luminence, but if 1-microsecond pulses are used and the effect of incident infrared radiation is integrated for a millisecond, then 10 milliamps peak currents can be obtained with an average of $6\times10^{-}$foot Lamberts. Thus, for this GaAsP emitter there has been an increase of two orders of magnitude in quantum efficiency, using the DC to pulse conversion. It is also to be noted that pulsed currents yield higher quantum efficiencies than DC currents, because pulsing yields less temperature rise at the junction of the emitter.

Figure 6:
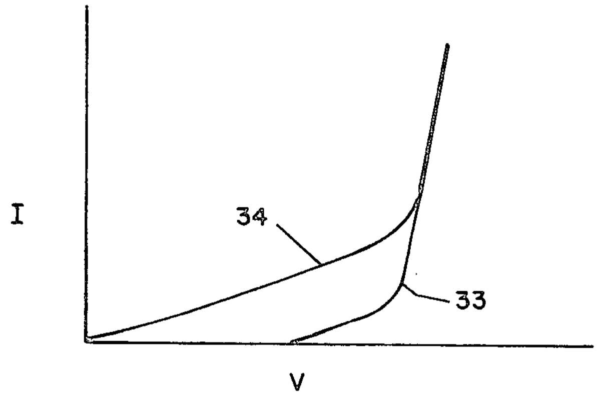
FIG. 6 shows current-voltage characteristics of the same emitter.

Current-voltage curves for a GaAsP emitter are shown in FIG. 6. The lower trace 33 in this Figure represents the diode itself and the upper trace 34 includes a 1,000-ohm shunt resistance. (This resistance is required to allow for discharge of the capacitor.) By using a backward diode emitter, the shunt capacitance can be eliminated, but the shunt resistor also allows the bypass of high signals due to average background and due to parallel resistance of the detector.

The simplest use of the radiation converter 1 is perhaps to convert invisible radiation to visible radiation so that the presence of the invisible radiation may be noted by an observor. Another use that can be practiced with the invention is to convert an invisible image into a visible image. A two-dimensional array of converters is provided to define an incident plane on which an image of incident radiation is focused. The output radiation from such an array of converters will yield the same image at the output wavelength. Thus, an incident infrared image which is invisible to the eye can be converted to a visible image using no more than an array of converters such as shown in FIG. 1, each electrically energized as described and arranged in close formation to define an incident image plane.

Figure 8:
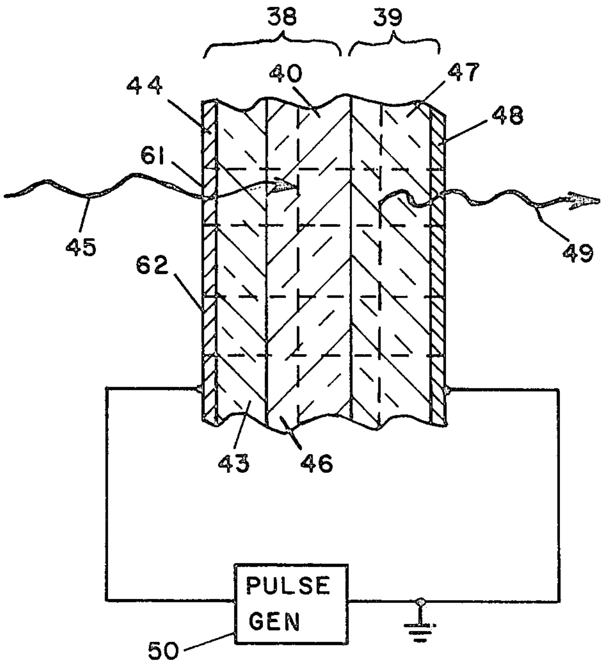
FIG. 8 is a sectional view showing a sandwich of semiconductor layers formed in a film with transparent electrically conductive layers on opposite sides thereof.

In place of an array of separate radiation converters, each constructed and operated as described and shown in FIG. 1, a relatively large area sheet formed of substantially the same layers of materials can be substituted. FIG. 8 is a sectional view through such a sheet. The layers which form the sheet consist of two principal sections 38 and 39. The layers 38 at any point on the sheet form a series capacitor and a diode detector, such as described above with reference to FIG. 1. The layers 39 form at that same point a radiation emitter, such as described above with reference to FIG. 1.

More particularly, the layers 38 forming the capacitor and detecting diode may be constructed as any of the MOS or MIS structures described herein or in the above-mentioned copending application. This includes a layer 40 of semiconductor material, an insulator layer 43 formed on the surface of the semiconductor material over the relatively large area of the surface and an electrically conductive film 44 formed on the insulator layer.

The conductive film 44 and the insulator layer 43 are transparent to the incident radiation 45, which is focused on a depletion region 46 in the layer 40. The depletion region is formed in the semiconductor layer 40 immediately adjacent the insulator layer, just as the depletion region is formed in the MOS and MIS structures described in the copending application and described above with reference to FIG. 1. The extent of the charge depletion in region 46 can be increased by applying a DC field through the layers.

At each point throughout the area of the sheet, the layers 39 form the equivalent of the emitter diode 6 and electrically conductive base 19, shown in FIG. 1. The emitter diode is provided by the layer 47, which is contiguous with the semiconductor layer 40, in which the depletion region is formed, and a transparent electrically conductive film 48. Thus, the sheet is clad on both sides by thin films of electrically conductive materials, which are transparent to certain radiation. The conductive film 44 is transparent to the incident radiation 45 that is directed to the depletion region 46 and the film 48 is transparent to the output radiation 49 from the emitter diode layer 47.

If the sheet is made sufficiently thin, then the electrical impedance through each of the layers forming the sheet will be substantially less than the electrical impedance along each layer in the plane of the sheet, and so electrical impedance through the semiconductors in the sheet from point to point along the sheet (such as between points 61 and 62) may be quite high. Depending on the material used and the thickness of the layers, this impedance in the plane of the sheet can be so much greater than impedance through the sheet that the definition of the incident radiation 45 on point 61 may be retained by the output radiation 49 from this point. Since loss of definition is most likely to occur due to dissipation of the charge on the integrating capacitor from one point to an adjacent point on the sheet, and by charging current pulses which flow from point to point on the sheet through the diode emitter layer 47, it becomes important that the layers 40 and 47 be quite thin. When these layers are thin, the impedance through the layers can be much less than impedance between adjacent points on the layers.

This problem of loss of definition can be overcome by increasing the impedance through the layers 40 and 47 from point to point on the sheet to form, in effect, an impedance barrier through these layers between the points. For example, the impedance of semiconductor materials can be altered considerably by exposing to particle radiation. The impedance of gallium arsenide can be changed a number of orders of magnitude by exposure to proton radiation. Thus, each point on the sheet can be isolated from the adjacent point with respect to conduction through the layers 40 and 47 by placing a protective mask over the sheet covering the points and exposing spaces between points to selected radiation to increase the impedance through these layers between the points.

In operation, the output of a pulse generator 50 is applied across the conductive films 44 and 48 so that at each point in the sheet intense current pulses derived from the pulse generator 50 and of amplitude representing the integrated incident radiation at the point, are conducted by the radiation emitter 47 at the same point causing it to emit a pulse of output radiation of intensity which varies directly as the integral of the incident radiation over the period between pulses from the generator 50.

Figure 9:
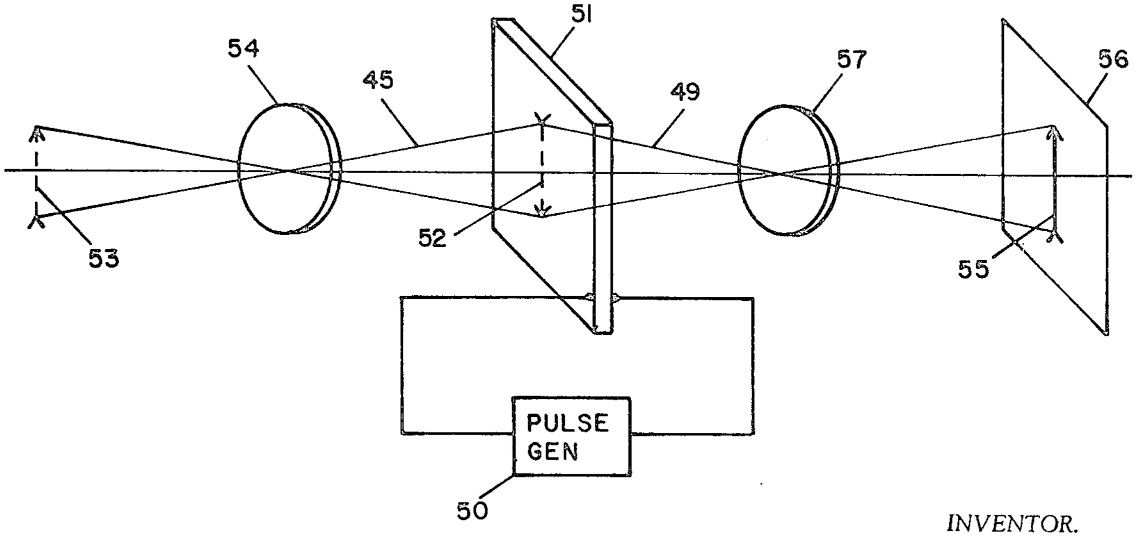
FIG. 9 is a schematic illustrating a particular use of a sheet of the film shown in FIG. 8, for converting an image at one wavelength into the image at another wavelength.

Use of the sheet formed as shown in FIG. 8 for converting an incident image of radiation into the same image at a different wavelength is illustrated in FIG. 9. The sheet 51 formed as shown in FIG. 8 and energized by pulse generator 50 as described with reference to FIG. 8, is part of an optical system which focuses on the sheet 51, an image 52 of an object 53. The radiation from the object 53 may be invisible (it may be infrared) and is focused on the depletion layer in the sheet 51 by a suitable optical system 54. Meanwhile, the pulse generator 50 applies pulses across the conductive layers 44 and 48 of the sheet 51, so that radiation emanates from the emitter layer 47 of the sheet, which defines the image 52, but with radiation at the output wavelength. This output radiation may be focused as an image 55 on a screen 56 by a suitable optical system 57. For example, the radiation 45 focused by the system 54, on the sheet 51, may be infrared in the range of 5.4-micron wavelength and so the image 52 is an infrared image of the object 53. If the sheet 51 is constructed as shown in FIG. 8 with a layer of InSb contiguous with a layer of GaAsP and the surface of the InSb anodized to form the oxide layer 43, and with conductive layers 44 and 48 on each side of the composite structure, then the incident radiation image at 5.4 microns will be converted to a visible image at about 0.6 to 0.7 micron wavelength. Quite clearly, a conventional TV camera such as vidicon or an image orthogon can be substituted for the screen 56 and so the camera would receive the visible image of an object radiating infrared radiation. This of course illustrates but one useful application of the invention, in addition to others described herein.

Specific materials have been described herein for forming the radiation detector, the integrating capacitor, and the radiation emitter. The detector and capacitor are generally described as an MIS structure and the emitter as an emitting diode contiguous therewith to form a composite solid-state radiation converter, operating at relatively high efficiency. Other materials in addition to those already mentioned could be used to form the detector capacitor and emitter. For example, the detector 10 or 40 could be PbTe or PbSnTe. The insulator layer 13 or 43 could be $S_1O_2$, $M_gO$ or oxides of the detector semiconductor material. The emitter could be GaAs or GaAlAs. These are but a few of many materials which could be used to practice the invention.

The various embodiments of a solid-state device for converting incident radiation of one wavelength into output radiation of another wavelength are described herein by way of example and are not intended to limit the spirit and scope of the invention as set forth in the accompanying claims.

I claim:

1. A device for producing output radiation in response to input radiation comprising contiguous layers of materials defining an MIS structure for storing and discharging electrical charge and a current driven diode radiation emitter contiguous to said MIS structure, said MIS structure being responsive to said input radiation, discharging the stored electrical charge such that the discharge current varies as said incident radiation is varied, said diode radiation emitter producing output radiation when energized by electric current, and means in electrical circuit with the MIS structure and the diode radiation emitter for producing electric current pulses, whereby, during the interval of each pulse the MIS structure is charged and the diode emitter is energized by the charging current to produce the output radiation and during the interval between pulses the MIS structure discharges a portion of the stored charge, said portion varying as the input radiation varies.

2. A device as in claim 1 and in which, the electrical equivalent of the MIS structure is a detector diode in electrical series with a capacitor and the pulse-producing means biases the detector diode in its forward direction during the interval of each pulse and in its backward direction during the intervals between pulses.

3. A device as in claim 2 and in which, the emitter diode is in electrical series with the MIS structure and is coupled in the same electrical direction as the detector diode part of the MIS structure.

4. A device as in claim 3 and in which, the capacitance of the capacitor part of the MIS structure is greater than the combined intrinsic capacitances of the detector and emitter diodes.

5. A device as in claim 3 and in which, the detector diode part of the MIS structure is made of InSb and the input radiation is infrared.

6. A device as in claim 5 and in which, the emitter diode is made of GaAsP and the output radiation is visible.

7. A device as in claim 4 and in which, the contiguous layers forms an array of devices, the input radiation defines an image, means are provided for focusing the image on the array, and the output radiation from the array defines the same image.

8. A device as in claim 1 and in which, the layer of insulator in the MIS is an oxide.

9. A device for producing output radiation in response to input radiation comprising in combination, a body of semiconductor material of given conductivity type, a layer of insulator at a surface of said body producing a charge depletion region in said semiconductor body, a layer of electrically conductive material on said layer of insulator, the capacitance across said insulator layer being substantially greater than the capacitance across said depletion region, means for directing the input radiation to said semiconductor material, current-driven radiation-emitting diode in electrical circuit contiguous to the body of semiconductor for producing output radiation when energized by an electric current and means in electrical circuit with the body of semiconductor and the output radiation-emitting diode for producing electric current pulses.

10. A device as in claim 9 and in which, during the interval of a pulse, the radiation-producing means is energized and the capacitance of said insulator layer is charged and during the interval between pulses the capacitance of said insulator layer is at least partially discharged depending upon the incident radiation.

11. A device as in claim 9 and in which, the layer of insulator produces in the semiconductor immediately adjacent thereto a region of substantial electric charge depletion which forms a PN-like diode junction in the detector semiconductor material.

12. A device as in claim 9 and further including, means for applying an electrical voltage to the layer of electrically conductive material to cause in the semiconductor body immediately adjacent to the layer of insulator a region of substantial electric charge depletion which forms a PN-like diode junction in the detector semiconductor body.

13. A device as in claim 9 and in which, the layer of electrically conductive material and the insulator layer are at least partially transparent to the input radiation which is directed through these to the semiconductor body.

14. A device as in claim 9 and further including, means for applying an electrical voltage to the layer of electrically conductive material to cause in the semiconductor body immediately adjacent to the layer of insulator, a region of substantial electric charge depletion which forms a PN-like diode detector junction in the detector semiconductor body.

15. A device as in claim 9 and in which, the electrical cause pulses the emitter to produce the output radiation representative of the intensity of the input radiation.

16. A device as in claim 15 and in which, the current pulses charge the capacitor defined by the layer of insulator, the amplitude of the electric current pulses being indicative of the integrated intensity of input radiation over the interval between pulses.

17. A device as in claim 16 and in which, the capacitance across the layer of insulator is substantially greater than the capacitance across the detector semiconductor body and the emitter.

18. A device as in claim 17 and in which, the semiconductor material is InSb, the emitter is a GaAsP diode, the input radiation is infrared, and the output radiation is visible.

* * * * *